United States Patent [19]
Miura

[11] Patent Number: 5,898,214
[45] Date of Patent: Apr. 27, 1999

[54] WIRE BONDING DEVICE

[75] Inventor: Takeo Miura, Kumamoto, Japan

[73] Assignee: NEC Corporation, Japan

[21] Appl. No.: 09/090,821

[22] Filed: Jun. 4, 1998

[30] Foreign Application Priority Data

Jun. 20, 1997 [JP] Japan ................................ 9-164741

[51] Int. Cl.[6] .............................................. H01L 23/495
[52] U.S. Cl. ............................................ 257/666; 267/798
[58] Field of Search ................................ 257/666, 668, 257/670, 676, 734, 735, 738, 798

[56] References Cited

U.S. PATENT DOCUMENTS 5,801,432   9/1998   Rostoker et al. ..................... 257/666
5,808,354   9/1998   Lee et al. ............................ 257/666

FOREIGN PATENT DOCUMENTS 344051   2/1991   Japan ........................ H01L 21/607

*Primary Examiner*—Carl Whitehead, Jr.
*Attorney, Agent, or Firm*—Hayes, Soloway, Hennessey, Grossman & Hage, P.C.

[57] ABSTRACT

A wire bonding device effects a bonding technique using ultrasonic waves to connect a chip having a semiconductor element and inner lead portions of a leadframe together by using metal fine wires. Herein, the wire bonding device employs a general-use leadframe, which is constructed in such a way that an angle of 0° or 90° is formed between the inner lead portions and frame. A frame guide is provided to transport the leadframes, which are placed at prescribed positions at a wire bonding mode. A bonding tool applies ultrasonic waves to connect the chip and the inner lead portions of the leadframe together by using the metal fine wires. An ultrasonic wave transmission arm holds the bonding tool at a tip portion thereof. The arm is capable of moving close to or apart from the leadframes, wherein a prescribed angle (e.g., 45°) is kept between moving directions of the arm and longitudinal directions of all of the inner lead portions of the leadframes. A bonding head, which is mounted on a bonding stage, supports the arm to have a capability of free movement while keeping the prescribed angle with respect to the inner lead portions. The bonding stage is capable of moving in axial directions thereof when being driven. Thus, the wire bonding device is capable of reducing the dispersion in applying directions of the ultrasonic waves with respect to the chips and the inner lead portions of the leadframes.

5 Claims, 4 Drawing Sheets

WIRE BONDING DEVICE

BACKGROUND OF THE INVENTION

1. Field of the Invention

This invention relates to wire bonding devices that apply ultrasonic waves to connect chips having semiconductor elements to inner lead portions of leadframes by using metal fine wires in the assembly process of semiconductor devices. This application is based on patent application No. Hei 9-164741 filed in Japan, the content of which is incorporated herein by reference.

2. Description of the Related Art

The paper of Japanese Patent Application, Publication No. Hei 3-44051 discloses an example of the wire bonding device.

FIG. 3 is a plan view showing a leadframe which is employed by the above wire boding device. Herein, a reference symbol "1" designates an island portion which has a square shape and which has multiple tab-hanging leads 1A. A reference symbol "2" designates inner lead portions that are arranged at periphery of the island portion 1. A reference symbol "3" designates outer lead portions that are arranged at periphery of the inner lead portions 2. A reference symbol "4" designates a frame that is constructed by outer frames 4A and inner frames 4B.

The inner lead portions 2 of the leadframe are arranged along a diagonal X, which connects intersection points formed between the outer frames 4A and the inner frames 4B. Herein, an angle θ formed between the diagonal X and a line Y, which is drawn to pass the tab-hanging leads 1A, is set at 45°.

FIG. 4 is a perspective view showing the aforementioned wire bonding device. Herein, a reference symbol "5" designates a heat stage that heats the leadframe. A reference symbol "6" designates a frame guide that transports and holds the leadframe. A reference symbol "7" designates an ultrasonic wave oscillator. A reference symbol "8" designates a bonding head. A reference symbol "9" designates an ultrasonic wave transmission arm, which is attached to the bonding head 8. A reference symbol "10" designates a bonding tool, which is attached to a tip portion of the ultrasonic wave transmission arm 9. Incidentally, a reference symbol "11" designates a connector wire, while "12" designates a chip having a semiconductor element.

In the wire bonding device whose construction is described above, the bonding tool 10 and the ultrasonic wave transmission arm 9 attached to the bonding head 8 generate ultrasonic waves, which are applied to the leadframe and the chip 12. Herein, an angle of 90° is provided between an applying direction of the ultrasonic waves and a transportation direction of the frame 4. An overall shape of the leadframe is designed in such a way that all of the inner lead portions 2 and all of the outer lead portions 3 are both slanted by an angle of 45° against the frame 4. Thus, it is possible to guarantee slanted transmission of the ultrasonic waves, which are transmitted to all of the inner lead portions 2 in their longitudinal directions by an angle of 45°.

The aforementioned wire bonding device has some problems, which will be described below.

A first problem is an increase of the cost for manufacturing the leadframes by the aforementioned wire bonding device. As a result, the manufacturing cost of the semiconductor device that is manufactured using the above leadframe becomes higher.

Because, the aforementioned wire bonding device is designed such that all of the island portion 1, inner lead portions 2 and outer lead portions 3 are slanted against the frame 4 by 45°. For this reason, the leadframe requires "independent" parts for the outer lead portions, which are conventionally used as the common parts of the outer frame. So, the leadframe should increase the frame size and frame area.

A second problem is that the aforementioned wire bonding device requires specially designed leadframes, which are different from the conventional and generally designed leadframes. That is, the wire bonding device cannot use the conventional leadframes. For this reason, it is necessary to change the design of the leadframes and to re-manufacture the leadframes, which requires an enormous cost.

Because, the generally designed leadframe, which is conventionally used, is designed in such a way that all the inner lead portions and outer lead portions are slanted by an angle of 0° or 90° against the frame.

SUMMARY OF THE INVENTION

It is an object of the invention to provide a wire bonding device which is capable of using the conventional leadframes while reducing the dispersion in applying directions to apply ultrasonic waves to inner lead portions and chips having semiconductor elements.

It is another object of the invention to provide a wire bonding device whose size is not enlarged so much.

According to a wire bonding device of this invention, it is possible to employ a general-use leadframe, which is constructed in such a way that an angle of 0° or 90° is formed between inner lead portions and frames.

Now, a frame guide transports the leadframes, which are placed at prescribed positions at a wire bonding mode. A bonding tool applies ultrasonic waves to connect the chip and the inner lead portions of the leadframe together by using the metal fine wires. An ultrasonic wave transmission arm holds the bonding tool at a tip portion thereof. The arm is capable of moving close to or apart from the leadframes, wherein a prescribed angle (e.g., 45°) is kept between moving directions of the arm and longitudinal directions of all of the inner lead portions of the leadframes. A bonding head, which is mounted on a bonding stage, supports the arm to have a capability of free movement while keeping the prescribed angle with respect to the inner lead portions. The bonding stage is capable of moving in axial directions thereof when being driven.

Thus, the wire bonding device of this invention is capable of reducing the dispersion in applying directions of the ultrasonic waves with respect to the chips and the inner lead portions of the leadframes. In addition, the wire bonding device of this invention is not necessarily increased in size.

BRIEF DESCRIPTION OF THE DRAWINGS

These and other objects of the subject invention will become more fully apparent as the following description is read in light of the attached drawings wherein.

DESCRIPTION OF THE PREFERRED EMBODIMENT

Figure 1:
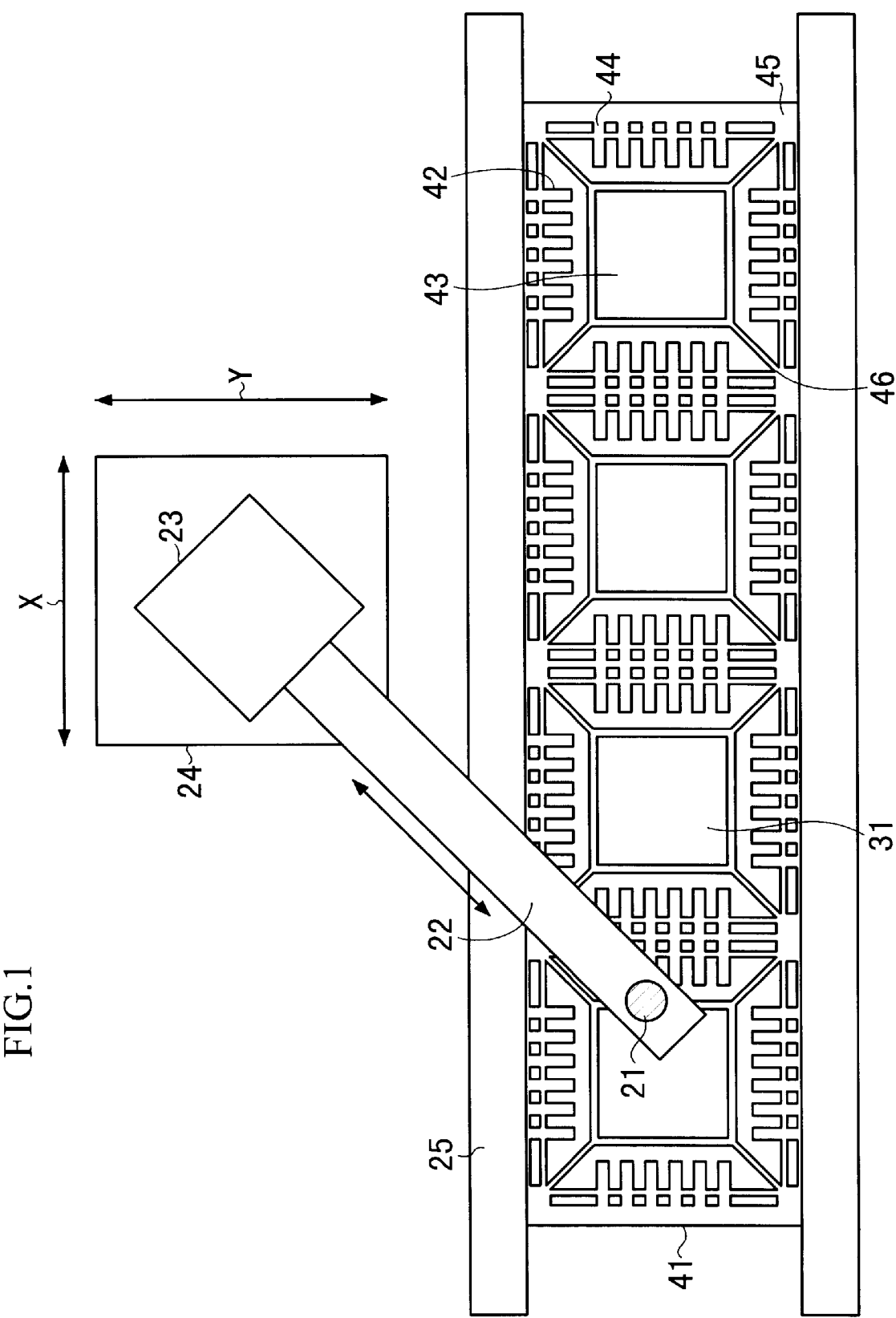
FIG. 1 is a plan view showing an example of a wire bonding device in accordance with this invention.

FIG. 1 is a plan view showing an example of a wire bonding device in accordance with this invention. Herein, a reference symbol "21" designates a bonding tool that radiates ultrasonic waves to connect a chip 31 having a semiconductor element to inner lead portions 42 of a leadframe 41 by using metal fine wires. A reference symbol "22" designates an ultrasonic wave transmission arm holding the bonding tool 21 at a tip portion thereof.

In addition, a reference symbol "23" designates a bonding head that supports the ultrasonic wave transmission arm 22 in such a way that the arm 22 can freely move close to or apart from the leadframe 41. Herein, the bonding head 23 supports the arm 23 to keep a fixed angle of 45° against the inner lead portion 42. A reference symbol "24" designates a bonding stage that can be controlled and driven in two axial directions (i.e., X and Y). The bonding stage 24 holds the bonding head 23 to have a capability of free movement with respect to the leadframe 41. A reference symbol "25" designates a frame guide that transports the leadframes 41 so as to keep them at prescribed positions at a wire bonding mode. Incidentally, it is possible to use another structure for driving the bonding stage 24. That is, the structure of the bonding stage 24 is not necessarily limited to the aforementioned structure which provides the drive in the two axial directions.

The ultrasonic wave transmission arm 22 is supported in such a way that moving directions (shown by a bidirectional arrow in FIG. 1) thereof keep a prescribed angle (e.g., 45°) against longitudinal directions with respect to all of the inner lead portions 42. Thus, it is possible to apply ultrasonic waves to all of the inner lead portions 42 with the prescribed angle of 45°.

Figure 2:
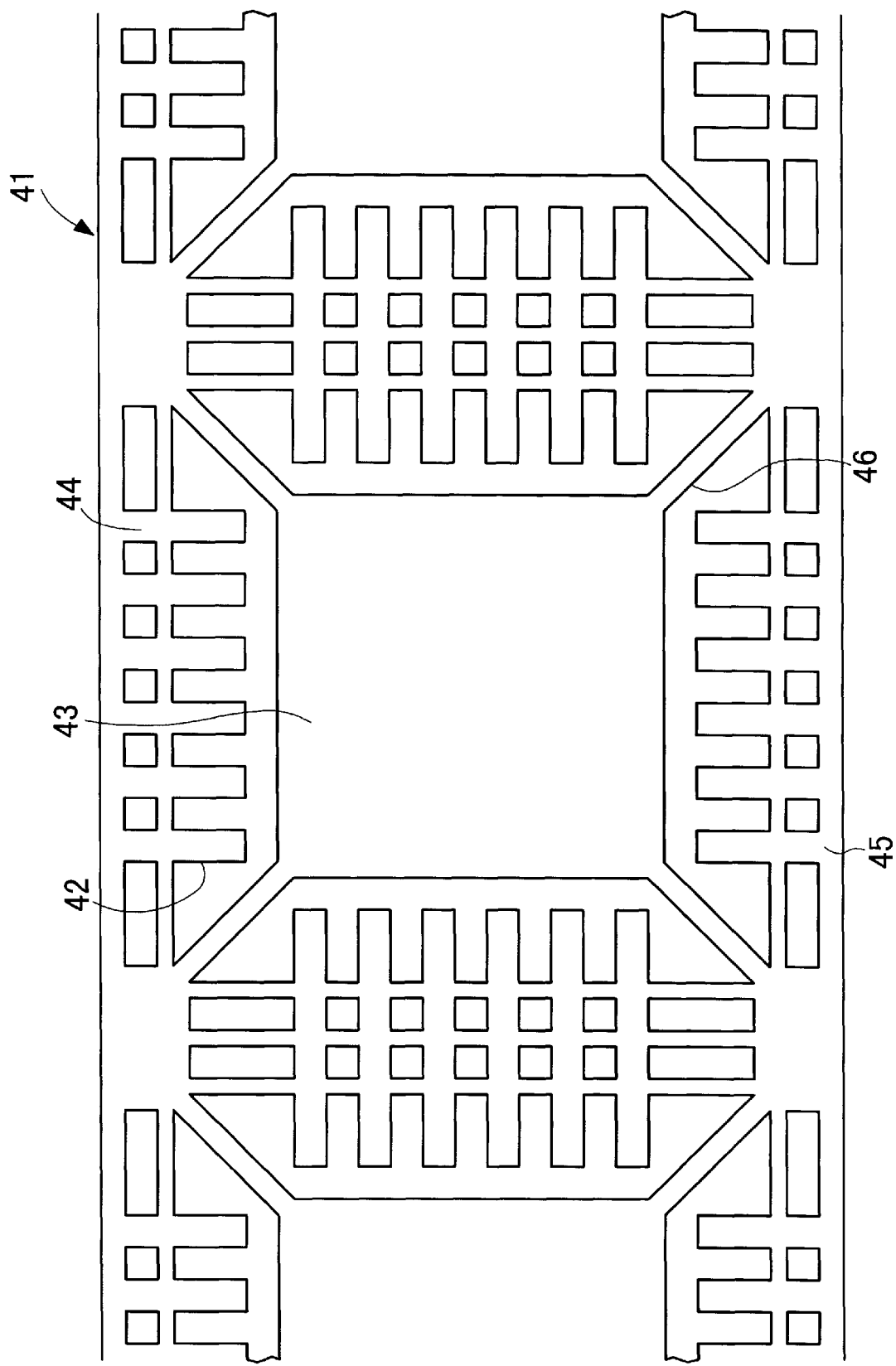
FIG. 2 is a plan view showing a leadframe which is employed in the wire bonding device of FIG. 1.
Figure 3:
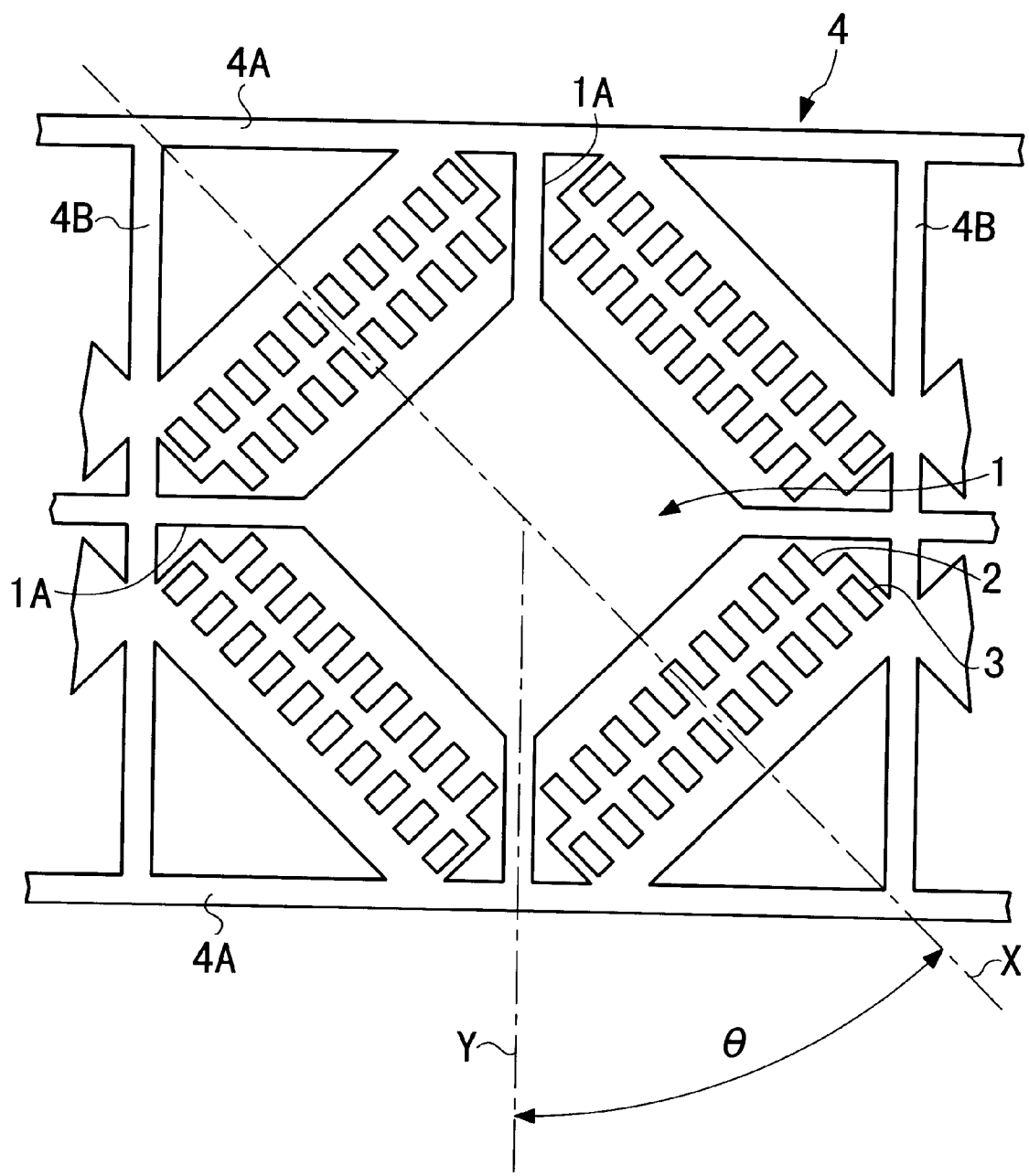
FIG. 3 is a plan view showing a leadframe which is employed by a conventional example of the wire bonding device.
Figure 4:
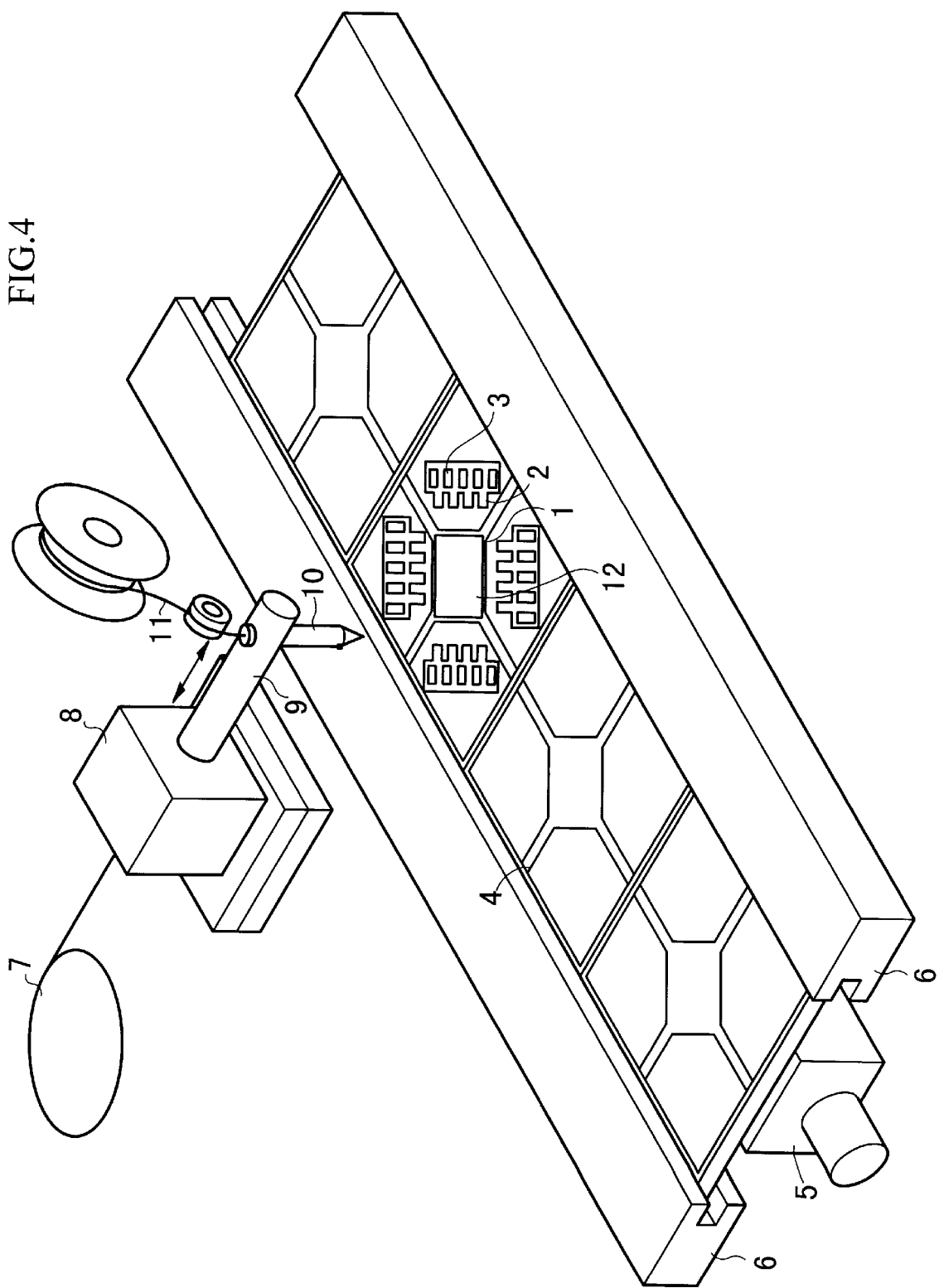
FIG. 4 is a perspective view showing the conventional example of the wire bonding device.

As shown in FIG. 2, the leadframe 41 corresponds to one kind of the general-use leadframes. That is, the leadframe 41 is constructed to contain an island portion 43 having a square shape, multiple inner lead portions 42 arranged at periphery of the island portion 43 and outer lead portions that are arranged outside of the inner lead portions 43 respectively. In addition, the leadframe 41 contains a frame 45 as well as hanging leads 46 that connect the frame 45 and the island portion 43 together.

The inner lead portions 42 are fixed to the frame 45 in such a way that an angle of 0° or 90° is formed between the inner lead portions 42 and the frame 45.

Next, the operation of the wire bonding device will be described in detail.

All of the inner lead portions 42 of the leadframe 41 are arranged such that they form an angle of 0° or 90° with respect to a transportation direction of the frame guide 25. The ultrasonic wave transmission arm 22 and the bonding head 23 are mounted on the bonding stage 24 in such a way that the bonding tool 21 vibrates with an angle of 45° with respect to all of the inner lead portions 42. The bonding stage 24 can be controlled and driven in X-axis and Y-axis directions.

The leadframes 41 are transported by the frame guide 25 and are subjected to wire bonding one by one. Herein, the wire bonding using ultrasonic waves is effected to connect a pad (not shown) of the chip 31 mounted on the island portion 43 to each of the inner lead portions 42. On the bonding stage 24 that are driven in the X-axis direction or Y-axis direction, the bonding head 23 is mounted to support the ultrasonic wave transmission arm 22. So, ultrasonic waves are generated from the bonding head 23 and are transmitted via the ultrasonic wave transmission arm 22. Thus, the ultrasonic waves are applied from the tip portion of the bonding tool 21 to the leadframe 41 with an angle of 45°.

According to the aforementioned wire bonding device, it is possible to keep a prescribed angle (e.g., 45°) for the moving directions of the ultrasonic wave transmission arm 22 with respect to the longitudinal directions of all of the inner lead portions 42. Thus, it is possible to apply ultrasonic waves to all of the inner lead portions 42 with an angle of 45°. So, it is possible to keep a "constant" applying direction of ultrasonic waves with respect to all of the inner lead portions 42 and pads of the chips 31 respectively. In other words, it is possible to reduce the dispersion in applying directions of ultrasonic waves. Therefore, it is possible to realize bonding states based the same condition. Thus, it is possible to reduce the dispersion in joint strength of bonding, while it is possible to stabilize joint strength of bonding.

Further, the present wire bonding device is capable of using the conventional (or general-use) leadframe 41. So, this device does not suffer from problems due to an increase of frame size and an increase of frame area which are caused to occur in the conventional wire bonding device using the specific leadframe wherein the island portion 1 and the inner lead portions 2 are slanted by 45° against the frame 4. Thus, the present wire bonding device is capable of reducing the manufacturing cost for the leadframes.

Moreover, as compared with the conventional necessity that the design for all the leadframes should be changed and modified, the present wire bonding device requires only a modification in attachment of the bonding head 23. So, this invention is capable of reducing an amount of investment (or cost) which is required to actualize a technical feature of this invention that ultrasonic waves are applied to all of the inner lead portions 42 with an angle of 45°.

As a result, this invention is capable of improving quality of the semiconductor devices as well as reliability in manufacture of the semiconductor devices. Further, this invention requires merely a change of an angle of the arm to introduce a change of a fixing position of the bonding head on the stage. So, there is no probability that the size of the device is enlarged. Thus, the device does not required high cost.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds are therefore intended to be embraced by the claims.

What is claimed is:

1. A wire bonding device comprising:
   a bonding tool for applying ultrasonic waves to connect a chip having a semiconductor element and inner lead portions of a leadframe together by using metal file wires;
   an arm for holding the bonding tool;
   a bonding head for supporting the arm such that the arm is capable of moving close to or apart from the leadframe; and
   a stage for holding the bonding head to have a capability of free movement with respect to the leadframe,
   wherein the arm is supported by the bonding head in such a way that a prescribed angle is kept between moving directions of the arm and longitudinal directions of all of the inner lead portions.

2. A wire bonding device as defined in claim 1 wherein the prescribed angle is 45°.

3. A wire bonding device comprising:

a frame guide for transporting leadframes, which are placed at prescribed positions at a wire bonding mode, wherein each of the leadframes has a general-use construction that inner lead portions are arranged at periphery of an island portion and are fixed to a frame in a prescribed positional relationship;

a bonding tool for applying ultrasonic waves to connect a chip having a semiconductor element and the inner lead portions of the leadframe by using metal fine wires;

an ultrasonic wave transmission arm for holding the bonding tool at a tip portion thereof, wherein the ultrasonic wave transmission arm is capable of moving close to or apart from the leadframe;

a bonding head for supporting the ultrasonic wave transmission arm in such a way that a prescribed angle relationship is kept between the ultrasonic wave transmission arm and the inner lead portions of the leadframes; and a bonding stage, driven in axial directions thereof, on which the bonding head is mounted.

4. A wire bonding device as defined in claim 3 wherein the prescribed positional relationship is established such that an angle of 0° or 90° is formed between the inner lead portions and the frame.

5. A wire bonding device as defined in claim 3 wherein the prescribed angle relationship is established such that an angle of 45° is formed between moving directions of the ultrasonic wave transmission arm and longitudinal directions of all of the inner lead portions of the leadframes.

\* \* \* \* \*